United States Patent [19]
Sato et al.

[11] Patent Number: 5,321,301
[45] Date of Patent: Jun. 14, 1994

[54] SEMICONDUCTOR DEVICE

[75] Inventors: Fumihiko Sato; Tsutomu Tashiro, both of Tokyo, Japan

[73] Assignee: NEC Corporation, Tokyo, Japan

[21] Appl. No.: 43,804

[22] Filed: Apr. 7, 1993

[30] Foreign Application Priority Data

Apr. 8, 1992 [JP] Japan .................................. 4-86774
May 8, 1992 [JP] Japan .................................. 4-115609

[51] Int. Cl.$^5$ .................. H01L 27/082; H01L 27/102; H01L 29/70
[52] U.S. Cl. .................................... 257/592; 257/587; 257/588; 257/589; 257/557
[58] Field of Search ................ 257/587, 588, 197, 589, 257/592, 576, 557; 437/101

[56] References Cited

U.S. PATENT DOCUMENTS

| | | | |
|---|---|---|---|
| 4,710,241 | 12/1987 | Komatsu | 257/588 |
| 4,824,799 | 4/1989 | Komatsu | 257/588 |
| 5,140,400 | 8/1992 | Morishita | 357/197 |
| 5,227,329 | 7/1993 | Kobayashi et al. | 437/101 |

OTHER PUBLICATIONS

Tang, D. D. and Lu, P., "A Reduced-Field Design Concept for High-Performance Bipolar Transistors," *IEEE Electron Device Letters*, vol. 10, No. 2, Feb. 1989, pp. 67-69.

Lu, P., et al., "The Implementation of a Reduced-Field Profile Design for High-Performance Bipolar Transistors," *IEEE Electron Device Letters*, vol. 11, No. 8, Aug. 1990, pp. 336-338.

Konaka, S., et al., "A 20 ps/G Si Bipolar IC Using Advanced SST with Collector Ion Implantation," *Abstracts of the 19th Conference on Solid State Devices and Materials*, 1987, pp. 331-334.

*Primary Examiner*—William L. Sikes
*Assistant Examiner*—Fetsum Abraham
*Attorney, Agent, or Firm*—Mason, Fenwick & Lawrence

[57] ABSTRACT

The present invention relates to a semiconductor device which comprises: an n$^-$ type buried collector provided on an n type silicon epitaxial layer disposed in an emitter opening; an n$^-$ type silicon collector disposed on said collector; a p$^+$ type single crystal silicon intrinsic base layer; and an n$^+$ type single crystal silicon emitter wherein said p$^+$ type single crystal silicon intrinsic base layer is connected with a p$^+$type base electrode polycrystalline silicon through a p$^+$ type polycrystalline silicon graft base.

15 Claims, 9 Drawing Sheets

SEMICONDUCTOR DEVICE

BACKGROUND OF THE INVENTION

1. Field of the Invention

This invention relates to a semiconductor device, and more specifically to a bipolar transistor.

2. Description of the Prior Art

Referring to FIG. 1, there is illustrated a sectional view of a prior art NPN bipolar transistor which includes a base formed through ion implantation and which employs a self-alignment process, the bipolar transistor including a p⁻ type silicon substrate 201, an n⁺ type buried layer, an n⁻ type silicon epitaxial layer 203 formed on the former layer 202, and a LOCOS oxide film 204. The n⁺ type buried layer 202 is connected to an Al electrode 216 through an n⁺ type phosphorus diffusion layer 205 and an n⁺ type collector electrode polycrystalline silicon 208. A p⁺ type intrinsic base 217 formed through ion implantation on the surface of the n⁻ type silicon epitaxial layer 203 is connected with the side surface of a p⁺ type external base 218 formed on the surface of the n⁻ type silicon epitaxial layer 203 through impurity diffusion from a p⁺ type base electrode polycrystalline silicon 207. Further, an n⁺ type emitter 220 is formed on the surface of the intrinsic base 217 through impurity diffusion from n⁺ type emitter electrode polycrystalline silicon 219. Silicon oxide films 206, 214, and a silicon nitride film 209 electrically insulates the respective portions mentioned above. The above construction is basically the same as an SST (Super Self-Aligned Process Technology) one reported in the Proceedings of the 12th Solid State Devices Conference: Proc. of Solid State Device, P155, 1980.

The aforementioned prior art bipolar transistor is configured into a structure suitable for the formation of a base through an ion implantation process. Such an ion implantation process however suffers from a difficulty with channeling, and hence has in itself a limitation to a technique where a base is formed as a thin film. Further, as implantation conditions go to lower implantation energy and to higher doses for the purpose of a base making thinner, a heat teatment at a temperature lower than a predetermined one and within a predetermined period of time makes impossible the recovery of implantation damage and the activation of impurities.

Additionally, the foregoing bipolar transistor has another difficulty caused by its fabrication method. More specifically, the formation of a base of the foregoing bipolar transistor includes the following processes. A base electrode polycrystalline silicon is patterned, on the side wall of which is polycrystalline silicon an insulating film is formed, and an insulating film provided under which polycrystalline film is side-etched, and thereafter a non-implanted polycrystalline silicon is deposited by an LPCVD process, into which non-implanted polycrystalline silicon impurity is in turn diffused from an overhung portion of the foregoing base electrode polycrystalline silicon through a heat treatment. The non-implanted polycrystalline silicon is kept non-implanted as before excepting the lower part of the overhung portion. When the additional part of the polycrystalline silicon kept non-implanted is wet-etched by hydrazine and KOH, etc., and use is made of a (100)-oriented single crystal silicon substrate, etching rates of the single crystal silicon and the non-implanted polycrystalline silicon being wet-etched, the etching is advancd up to the (100)-oriented intrinsic base. This impedes in the prior art bipolar transistor the use of the (100)-oriented single crystal silicon substrate.

In contrast, there is disclosed a bipolar transistor with use of a low temperature epitaxial technique promising as the thin film base formation technique in the proceedings of the VLSI Technology Symposium (Symp. on VLSI Technology, pp. 91–92, 1989). More specifically, a base electrode polycrystalline silicon is patterned on a collector, and thereafter an epitaxial layer is grown to form a single crystal on a region where the aforementioned base electrode polycrystalline silicon is absent Since in this structure the emitter and the base fail to be formed in a self-alignment manner, an emitter opening part is needed to be formed on the single crystal base through lithography. This essentially results in a limitation to reduction of the device and makes it impossible to really produce parasitic capacitance and parasitic resistance. It is therefore impossible to realize a high speed bipolar transistor using the above structure.

There is further disclosed a technique to suppress Kirk effect by implanting phosphorus ion into a collector disposed just under an emitter for the purpose of achieving a high $f_T$ in the proceedings of the 19th Solid State Device and Materials Conference (Proceedings of Solid State Devices and Materials, pp.331–334, 1987). The technique surely enjoys a higher cut-off frequency $f_T$, but causes the severe deterioration of junction breakdown voltage because the junction is formed between a high concentration base and a high concentration collector. For improving such breakdown voltage a p-i-n structure may be constructed to prevent a direct junction from being formed between the high concentration base and the high concentration collector by disposing an i layer between those base and collector. Upon constructing such a structure through an ion implantation process a uniform concentration thicker i layer fails to be formed because of the affection of the tail of an impurity Gaussian distribution yielded upon ion implantation. For improving the breakdown voltage by moderating an electric field in a depletion layer between the collector and the base, an i layer with the width of the same order (i.e., about 100 nm) as that of the depletion layer, which is impossible in view of the aforementioned reason.

SUMMARY OF THE INVENTION

The present invention has been made in view of the above-mentioned circumstances, and has for its primary object to provide a semiconductor device which enjoys the use of a (100)-oriented single crystal silicon substrate and which includes a low concentration first conductivity type single crystal collector formed with the aid of a growth technique for a selective single crystal semiconductor layer (and polycrystalline semiconductor film) and a second conductivity type thin single crystal intrinsic base layer, and a first conductivity type single crystal emitter formed in a self-alignment manner to a base.

Another object of the present invention is to provide a semiconductor device which realizes simultaneously an improvement of a cut-off frequency $f_T$, an improvement of junction breakdown voltage between the collector and the base, reduction of parasitic resistance, and the achievement of fine elements.

In order to achieve the above objects, according to a first aspect of the present invention, there is provided a semiconductor device comprising:

a first conductivity type first single crystal silicon layer disposed on the surface of a single crystal silicon substrate;

a first insulating film disposed on the surface of said first single crystal silicon layer, covering the same therewith;

a first opening formed through said first insulating film until it reaches said first single crystal silicon layer;

a second conductivity type polycrystalline silicon film disposed on said first insulating film, including a protrusion at said first opening;

a second insulating film provided to cover the upper surface of said polycrystalline silicon film and further cover the sides of said polycrystalline silicon film at said protrusion;

a first conductivity type first single crystal semiconductor layer having lower impurity concentration than said first single crystal silicon layer and disposed on the surface of said first single crystal silicon layer, keeping a predetermined distance from said first opening;

a second conductivity type polycrystalline semiconductor film, connected with the bottom of said poycrystalline silicon film at said protrusion;

a second conductivity type second single crystal semiconductor layer disposed in said first opening, connected with the bottom of said polycrystalline semiconductor film, and serving to cover therewith said first single crystal semiconductor layer and said first single crystal silicon layer of a portion thereof where is not covered with said first single crystal semiconductor layer;

a third insulating film disposed on said second insulating film, covering therewith at least the sides and bottom of said second insulating film at said protrusion;

a second opening formed with said third insulating film, reduced in the shape thereof at a redetermined distance from the end of said protrusion; and a first conductivity type second single crystal silicon layer disposed on the surface of said second polycrystalline semiconductor layer at said second opening.

In order to achieve the above objects, according to a second aspect of the present invention there is provided a semiconductor device comprising:

a first conductivity type first single crystal silicon layer disposed on the surface of a single crystal silicon substrate:

a first insulating film disposed on the surface of said first single crystal silicon layer, covering the same layer therewith;

a first opening formed through said first insulating film until it reaches said first single crystal silicon layer;

a second conductivity type first polycrystalline silicon film disposed on said first insulating film, including a protrusion at said first opening;

a second insulating film provided to cover the upper surface of said polycrystalline silicon film and further cover the sides of said first polycrystalline silicon film at said protrusion;

a recessed portion provided in the surface of said first single crystal silicon layer, keeping a predetermined distance from said first opening;

a first conductivity type first single crystal semiconductor layer having lower impurity concentration than said first single crystal silicon layer and selectively disposed on said recessed portion with the surface thereof substantially coincident with the surface of said first single crystal silicon;

a second conductivity type polycrystalline semiconductor film, connected with the bottom of said first polycrystalline silicon film at said protrusion;

a second conductivity type second single crystal semiconductor layer disposed in said first opening, connected with the bottom of said polycrystalline semiconductor film, and serving to cover therewith said first single crystal semiconductor layer and said first single crystal silicon layer of a portion thereof where is not covered with said first single crystal semiconductor layer;

a third insulating film disposed on said second insulating film, covering therewith at least the sides and bottom of said second insulating film at said protrusion;

a second opening formed with said third insulating film, reduced in the shape thereof at a predetermined distance from the end of said protrusion;

a first conductivity type second single crystal silicon layer disposed on the surface of said second polycrystalline semiconductor layer at said second opening; and a first conductivity type second polycrystalline silicon film disposed on the surface of said first conductivity type second single crystal silicon layer at said second opening.

According to a third aspect of the present invention, there is provided a semiconductor device recited in the first or second aspect wherein said first single crystal semiconductor layer has first conductivity type impurity concentration of $5 \times 10^{15}$ cm$^{-3}$ at most and has the thickness of 20 nm or greater and 100 nm or less.

According to a fourth aspect of the present invention, there is provided a semiconductor device recited in the first or second aspect wherein said first conductivity type first single crystal semiconductor layer is a first conductivity type single crysal silicon layer, said second conductivity type polycrystalline semiconductor film is a second conductivity type polycrystalline silicon film, and said second conductivity type second single crystal semiconductor layer is a second conductivity type single crystal silicon layer.

According to a fifth aspect of the present invention, there is provided a semiconductor device recited in the first or second aspect wherein said first conductivity type first single crystal semiconductor layer is a first conductivity type single crystal silicon layer, said second conductivity type polycrystalline semiconductor film is a second conductivity type polycrystalline silicon-germanium alloy film, and said second conductivity type second single crystal semiconductor layer is a second conductivity type single crystal silicon-germanium alloy layer.

According to a sixth aspect of the present invention, there is provided a semiconductor device recited in the first or second aspect wherein said first semiconductor type first single crystal semiconductor layer is a first conductivity type single crystal silicon-germanium alloy layer, said second conductivity type polycrystalline semiconductor film is a second conductivity type polycrystalline silicon-germanium alloy film and said second conductivity type second single crystal semiconductor layer is a second conductivity type single crystal slicon-germanium alloy layer.

According to a seventh aspect of the present invention, there is provided a semiconductor device recited in one aspect out of the first to the sixth aspects wherein said polycrystalline silicon film includes a refractory metal silicide film on the upper surface thereof.

According to an eighth aspect of the present invention, there is provided a semiconductor device recited in one aspect out of the first to seventh aspects wherein said single crystal silicon substrate and said first conductivity type first single crystal silicon layer have (100) orientation.

The above and many other advantages, features and additional objects of the present invention will become manifest to those versed in the art upon making reference to the following detailed description and accompanying drawings in which preferred structual embodiments incorporating the principles of the present invention are shown by way of illustrative examples.

DETAILED DESCRIPTION OF THE PREFERRED EMBODIMENTS

In what follows, preferred embodiments of the present invention will be described with reference to the accompanying drawings.

Figure 1:
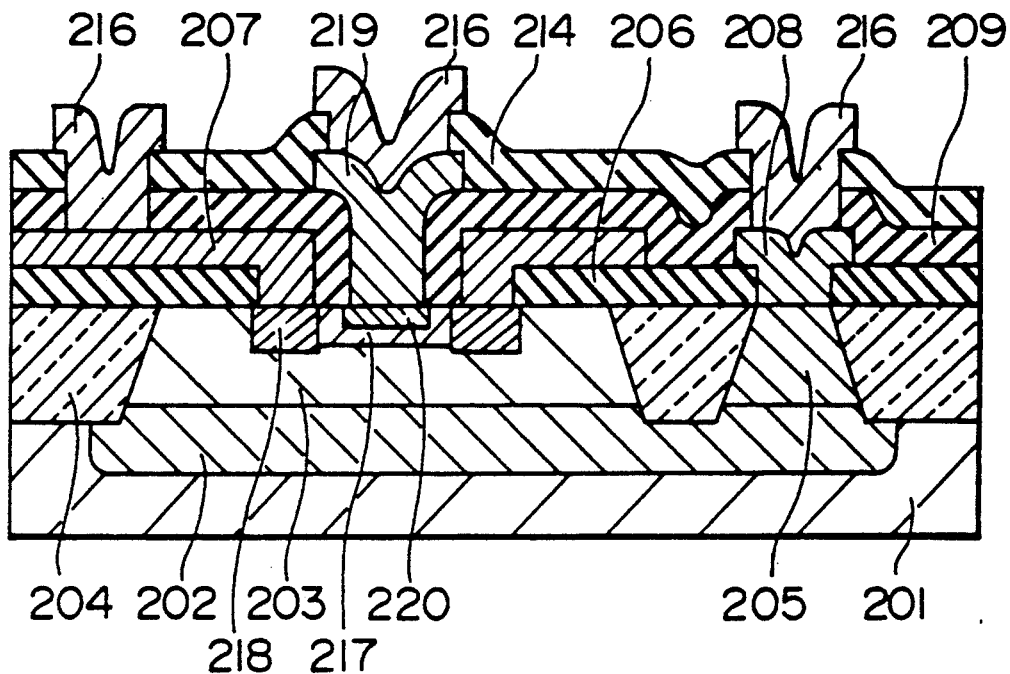
FIG. 1 is a sectional view illustrating a prior art semiconductor device.
Figure 2:
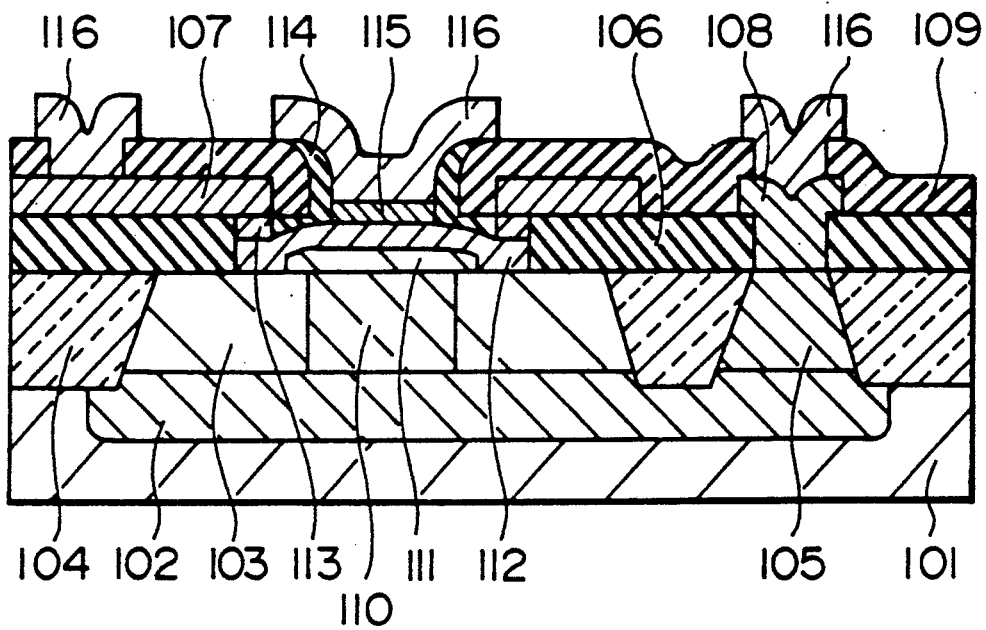
FIG. 2 is a sectional view illustrating a first embodiment of the present invention.

Referring to FIG. 2, which is a sectional view of an NPN bipolar transistor, the first embodiment of the present invention includes an about 10Ω·cm resistance p− type silicon substrate 101, an n+ type buried layer 102 into which arsenic is diffused from part of the surface of the silicon substrate 101, and an about $5 \times 10^{15}$ cm$^{-3}$ concentration about 1.2 μm thickness n− type silicon epitaxal layer 103 disposed on the n+ type buried layer 102. It further includes on the n− type silicon epitaxial layer 103 a LOCOS oxide film 104 for element isolation, and an n+ type phosphorus diffusion layer 105 for reduction of collector resistance. It still further includes a p+ type base electrode polycrystalline silicon 107 formed through a silicon oxide film 106 disposed on the epitaxial layer 103, and an n+ type collector electrode polycrystalline silicon 108 disposed on the phosphorus diffusion layer 105. It further includes an about $1 \times 10^{15}$ cm$^{-3}$ concentration about 50 nm thickness n type single crystal silicon collector 111 selectively epitaxially grown, separated away a predetermined distance from the silicon oxide film 106. In the silicon epitaxial layer 103 located on the lower portion of the silicon collector 111 there is provided an n+ type buried collector 110 which has its concentration uniformly varying from about $1 \times 10^{15}$ cm$^{-3}$ in the vicinity of the surface to that of the buried layer 102.

On the n− type single crystal silicon collector 111 and on a region of the n− type silicon epitaxial layer 103 not covered with the single crystal silicon collector 111 there is selectively epitaxially grown an about $3 \times 10^{18}$ cm$^{-3}$ concenration about 60 nm thickness p+ type single crystal silicon intrinsic base layer 112. The intrinsic base layer 112 is connected with the p+ type base electrode polycrystalline silicon 107 through a selectively deposited p+ type polycrystalline silicon graft base 113. On the single crystal silicon intrinsic base layer 112, there is provided through selective epitaxial growth an n+ type single crystal silicon emitter 115. The polycrystalline silicon graft base 113 is electrically isolated from the single crystal silicon emitter 115 by the silicon oxide film 114 formed as the side wall thereof. Al electrodes 116 serve as the emitter, base, and collector elecrodes.

Figure 3:
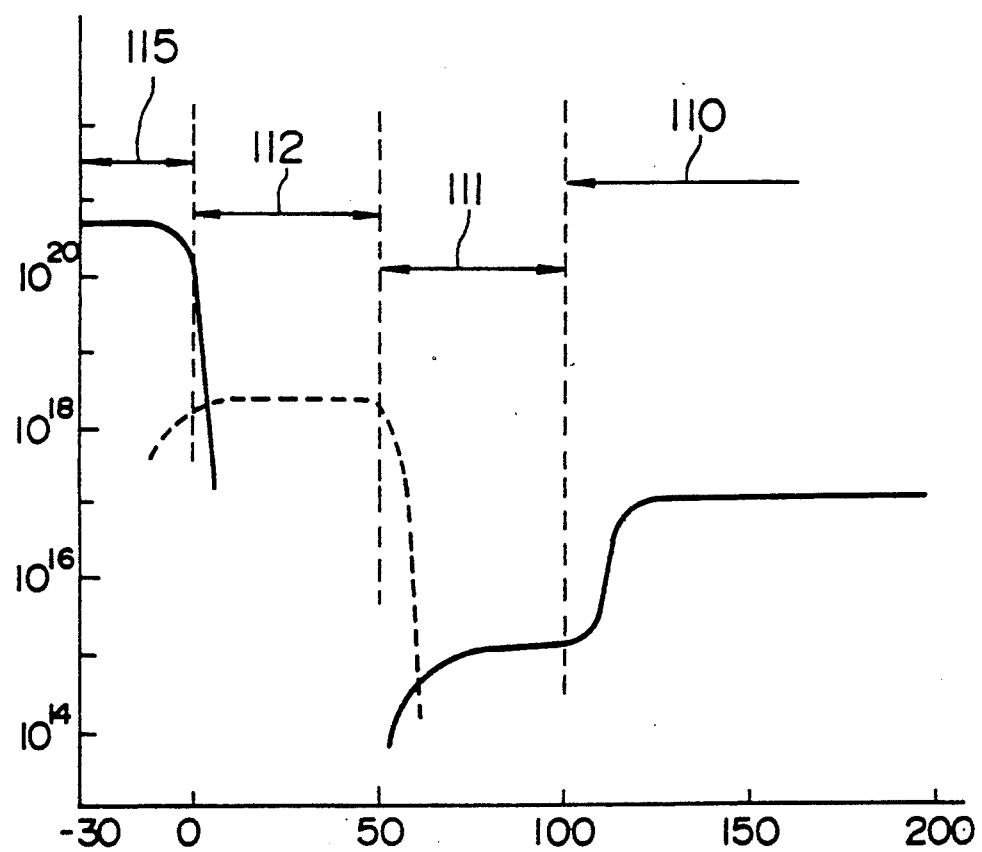
FIG. 3 is a graphical representation illustrating the effect of the first embodiment in which an impurity concentration distribution is presented.

Although the bipolar transistor in the present embodiment is of an NPN type, the present embodiment may be applicable to a PNP type bipolar transistor. Referring to FIG. 3, in which n and p type impurity concentration distributions in a depth direction are illustrated, the foregoing first embodiment includes an i layer formed owing to the n− type single crystal silicon collector 111 in the depth direction of the emitter opening. More specifically, a p-i-n structure is constructed in cooperation with the p+ type single crystal silicon intrinsic base layer 112, the n− type single crystal silicon collector 111, and the n− type buried collector 110.

The junction breakdown voltage between the collector and the base is specified by avalanche breakdown. A critical electric field at this time is of 2 to $6 \times 10^5$ V/cm. Provided the thickness of the foregoing n− type single crystal silicon collector 111 is of 20 nm, the junction breakdown voltage is improved by 0.4 to 1.2 V owing to the existance of the n− type single crystal silicon collector 111. Provided the thickness of the single crystal silicon collector 111 is thinner than 20 nm, the junction breakdown voltage is not improved. In a typical combination of impurity concentrations of the collector and the base, the spreading of the depletion layer between the collector and the base is of about 100 nm (the junction breakdown voltage between the collector and the base is improved by 2 to 6 V). Interposition of the 100 nm or more thickness single crystal silicon collector 111 is therefore insignificant. Whilst, the collector-emitter breakdown voltage without the prior art single crystal silicon collector structure was $BV_{CEO}=4.5$ V, that in the present embodiment is $BV_{CEO}=5.7$ V. Further, an experiment by the present inventors exhibits that as the impurity concentration of the aforementioned n− type single crystal silicon collector 111 becomes $5 \times 10^{15}$ cm$^{-3}$ or higher, the single crystal silicon collector fails to serve as the i layer.

Referring to FIGS. 4A to 4C and FIGS. 5A to 5C, which are sectional views each illustrating a method of fabricating the bipolar transistor in the order of processes, the bipolar transistor according to the first embodiment is fabricated as follows: The n+ type buried layer 102 is first formed on the surface of the p− type silicon substrate 101, and thereafter the n− type silicon epitaxial layer 3 is formed on the surface of the substrate 101. In the n− type silicon epitaxial layer 103 the LOCOS oxide film 104 and the n+ type phosphorus diffusion layer 105 are formed. Further, the silicon oxide film 106 is formed over the entire surface of the resulting wafer. The silicon oxide film 106 formed on the n+ type phosphorus diffusion layer 105 is opened to form the n+ type collector electrode polycrystalline surface 108. The p+ type base electrode polycrystalline silicon 107 is selectively formed on the surface of the silicon oxide film 106 and thereafter the first silicon nitride film is formed over the entire surface of the resulting wafer. In this stage, the p+ type base electrode polycrystalline silicon 107 is formed also on an emitter formation scheduled region.

Successively, with a photoresist taken as a mask, there are etched and removed the first silicon nitride film of the emitter formation scheduled region(emitter opening) and the p+ type base electrode polycrystalline silicon 107. With removal of the photoresist the second silicon nitride film is formed over the entire surface of the resulting wafer with the aid of an LPCVD process. The silicon nitride film 109 is formed by etching back the first and second silicon nitride films. The upper surface and side surface of the p+ type base electrode polycrystalline silicon 107 are covered with the silicon nitride film 109. The silicon nitride film serves as a side wall on the side surface of the p+ type base electrode polycrystalline silicon 107. The silicon oxide film 106 at the emitter opening is removed by wet-etching using an HF etching solution with the silicon nitride film 109 taken as a mask. Phosphorus ion implantation is carried out with the silicon nitride film 109 and the like taken as a mask under the conditions of ion concentration of $2\times10^{12}$ cm$^{-2}$ at 200 keV and $2\times10^{12}$ cm$^{-2}$ at 300 keV, and the phosphorus is activated with a 900° C., 30 minute heat treatment to form the n+ type buried layer 110 which extends from the surface of the n− type silicon epitaxial layer 103 to the n+ type buried layer 102.

Figure 4A:
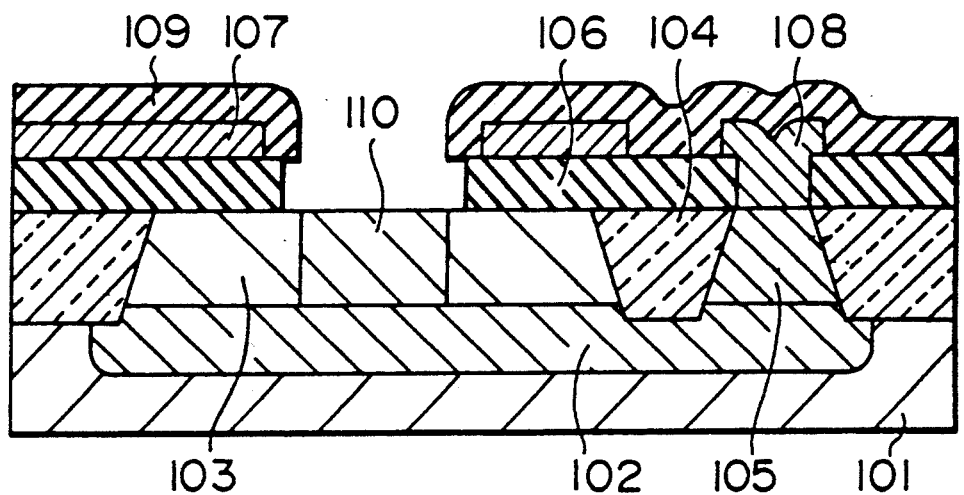
FIGS. 4 to 4C are a sectional views illustrating a first half of successive processes of fabricating a semiconductor device according to the first embodiment.
Figure 4B:
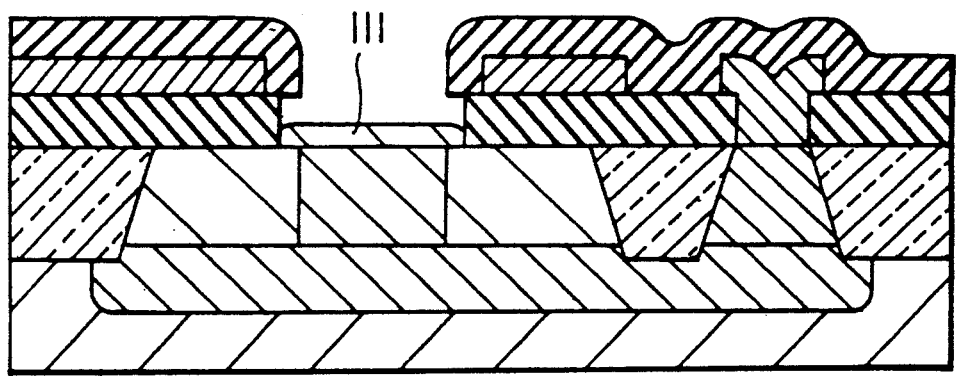

Successively, the n− type single crystal silicon collector 111 is selectively formed on the surface of the n− type silicon epitaxial layer 103 exposed to the emitter opening and on the surface of the n+ type buried layer 110 by a molecular beam epitaxy (MBE) process, as illustrated in FIG. 4B. As an example under the growth conditions, a silicon wafer possessing a structure illustrated in FIG. 4A is rendered to RCA cleaning and to HF etching, and is placed in an MBE chamber to remove a natural oxide film on the silicon by a 850° C., about 10 minute heat treatment. Thereafter, a 60 sccm $Si_2H_5$ containing $PH_3$ added thereto is forced to flow for about 6 minutes at the 600° C. substrate temperature to selectively grow the about 50 nm n− type single crystal silicon collector 111. The impurity concentration of the single crystal silicon collector 111 is controlled by the flow rate of added $PH_3$.

Figure 4C:
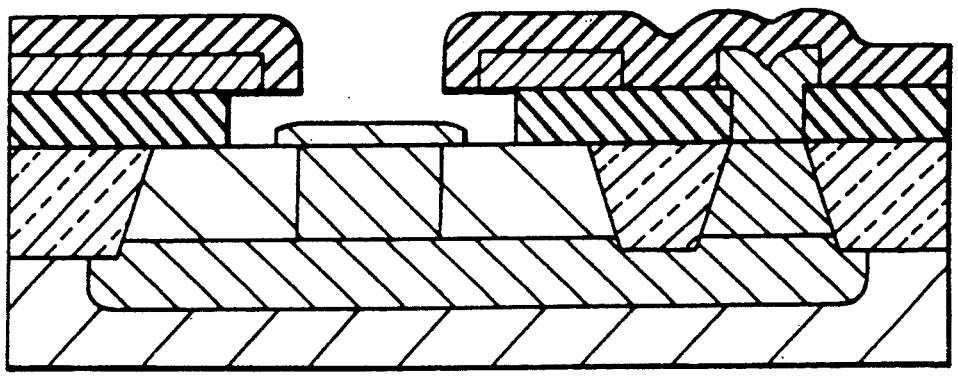

Successively, a silicon wafer with a structure illustrated in FIG. 4B is taken out from an MBE chamber, and etched by about 200 nm transversally of the silcicon oxide film 106 again using an HF etching solution. Hereby, the p+ type base electrode polycrystalline silicon 107 is exposed at the bottom of the end thereof to form a first opening and a protrusion of the p+ type base electrode polycrystalline silicon 107, as illustrated in FIG. 4C.

Figure 5A:
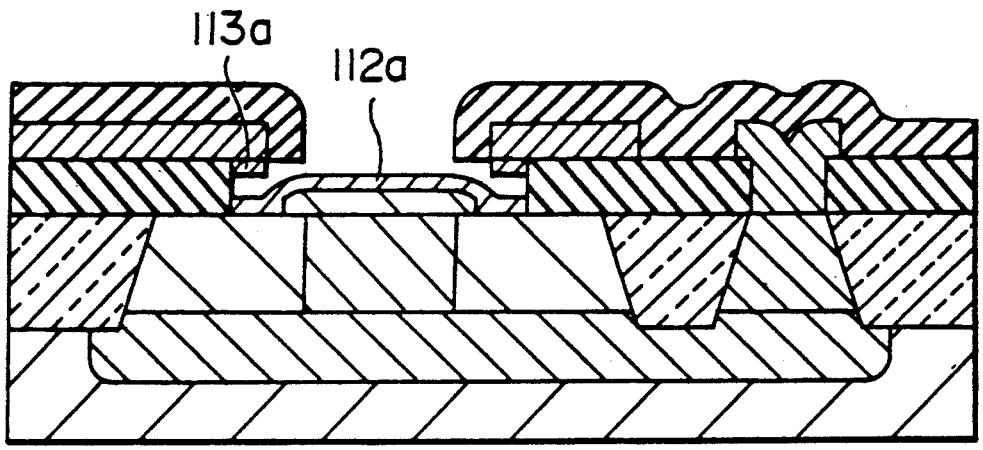
FIGS. 5A to 5C are a sectional views illustrating a second half of successive processes of fabricating the semiconductor device according to the first embodiment.
Figure 5B:
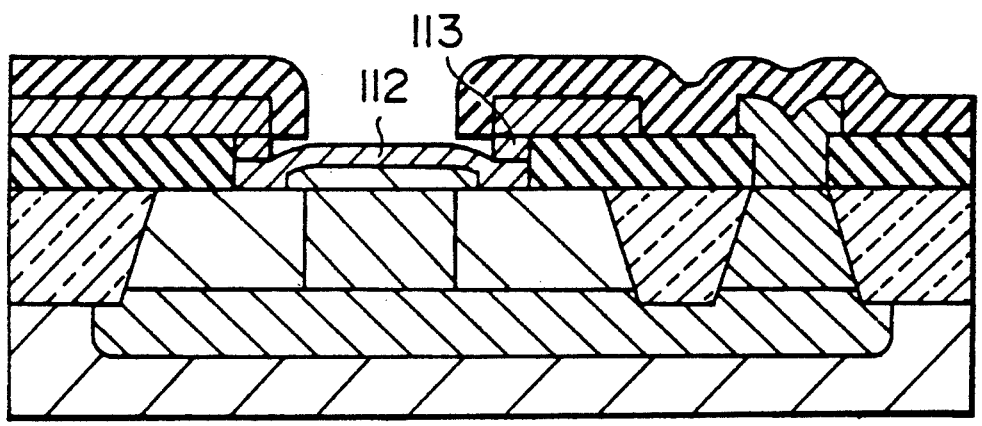

Silicon is grown with $Si_2H_6$ containing $B_2H_6$ added thereto a gain using an MBE process. In the middle of this growth, a p type polycrystalline silicon graft base 113a is grown on the bottom (lower surface) of the p+ type base electrode polycrystalline silicon 107 at the protrusion, and a p+ type single crystal silicon intrinsic base layer 112a is grown on the surface of the exposed n− type silicon epitaxial layer 103 and on the surface of the n− type single crystal silicon collector 111 (the bottom of the foregoing first opening) as illustrated in FIG. 5A. Further, the single crystal silicon intrinsic base layer 112a and the polycrystalline silicon graft base 113a are grown in succession to the single crystal silicon intrinsic base layer 112 and the polycrystalline silicon graft base 113 until the latters are connected, as illustrated in FIG. 5B.

Figure 5C:
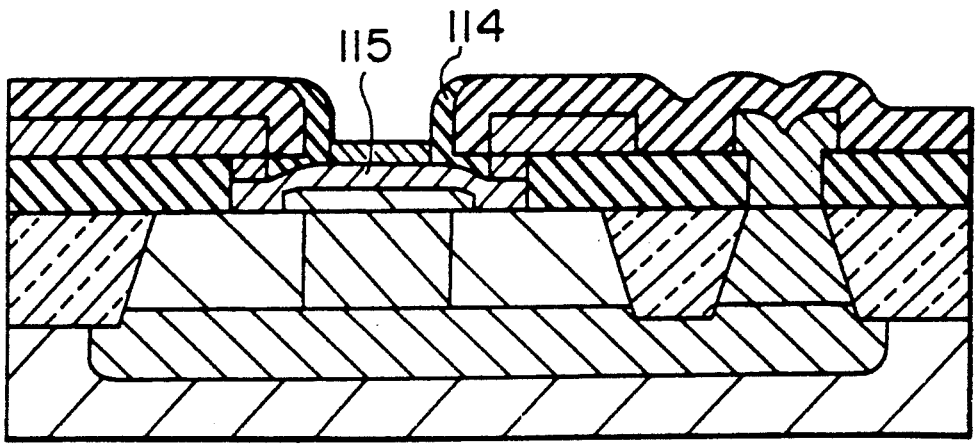

Successively, the silicon oxide film 114 is formed over the entire surface of the resulting wafer. The use of the LPCVD process allows the silicon oxide film 114 to be buried also in a space surrounded by the single crystal silicon intrinsic base layer 112, the polycrystalline silicon graft base 113, and the silicon nitride film 109. The silicon oxide film 114 is left behind so as to cover the side surface of the silicon nitride film 109 to form the second opening, by being etched back. Using again an MBE process, the n+ type single crystal silicon emitter 115 is selectively grown on the surface of the p+ type single crystal silicon intrinsic base layer 112a exposed to the second opening, as illustrated in FIG. 5C. Further, a connection port is formed in the silicon nitride film to form the Al electrode 116. Hereby, a bipolar transistor configured as illustrated in FIG. 2 is formed.

In the first embodiment, the MBE process ensures simultaneous formation of the p+ type single crystal silicon intrinsic base layer 112a and the p+ type polycrystalline silicon graft base 113, and eliminates such an etching process of the polycrystalline silicon film with use of hydrazine and KOH, etc., as in the prior art. The present embodiment can therefore enjoy the use of a (100) oriented silicon substrate without hindrance.

Although in the prior art bipolar transistor of the SST structure yielded through ion implantation and the like, it is impossible to realize the i layer which has such uniform low concentration and is made thinner and form the base which is made thinner, in the present embodiment the thinner single crystal silicon intrinsic base layer 112 is realizable without causing the problem of channeling, and the single crystal silicon collector 111 which becomes the i layer having uniform low concentration and is made thinner is formed on the n type buried collector 110. Accordingly, the SST structure bipolar transistor in the present embodiment can enjoy both higher base-collector junction breakdown voltage and higher cut-off frequency $f_T$. The present embodiment, which is easy to form the single crystal silicon emitter 115 on the single crystal silicon intrinsic base layer 112 in a self-alignment manner, greatly relaxes restrictions on device scaling-down compared with the prior art.

Figure 6:
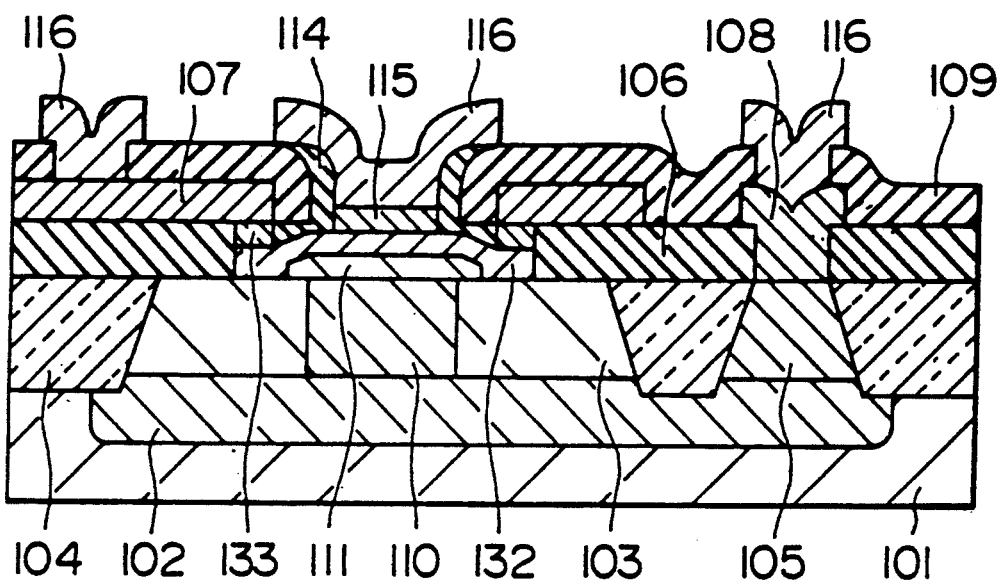
FIG. 6 is a sectional view illustrating a second embodiment of the present invention.

Referring to FIG. 6, which is a sectional view of a bipolar transistor, there is illustrated a second embodiment of the present invention wherein silicon and germanium alloy layers are formed using $GeH_4$ additionally to $Si_2H_6$ upon the graft base and the intrinsic base layer being grown through an MBE process. A p+ type single crystal silicon-germanium alloy intrinsic base layer 132 containing 15 mol % germanium is formed, covering the surface of the n⁻ type single crystal silicon collector 111 and the surface of a region of the n⁻ type silicon epitaxial layer 103 not covered with this single crystal silicon collector 111 (bottom of the first opening). Through a p+ type polycrystalline silicon germanium alloy graft base 133 formed simultaneously with the intrinsic base layer 132 the intrinsic base layer 132 is connected with the p+ type base electrode polycrystalline silicon 107. The polycrystalline silicon-germanium alloy graft base 133 is grown from the lower surface (bottom) of the p+ type base electrode polycrystalline silicon 107.

The forbidden bandwidth of the single crystal silicon-germanium alloy intrinsic base layer 132 is more narrowed than that of the n+ type single crystal silicon emitter 115. The narrowing depends on the mol % of germanium contained in the single crystal silicon-germanium alloy and on the amount of strain of the single crystal silicon-germanium alloy. The difference between the forbidden bandwidths of the intrinsic base layer 132 and the emitter 15 serves as a barrier against a minority carrier injected from the base to the emitter to restrict the increase of a base current. More specifically, it improves the cut-off frequency $f_T$ and satisfactorily increases a current-amplification factor $h_{FE}$ even when the base layer is made thinner and made high concentration in order to keep the collector-emitter breakdown voltage $BV_{CEO}$ at a predetermined value or higher.

It is noted that use may be made of a collector comprising an n⁻ type single crystal silicon germanium alloy instead of the n⁻ type single crystal silicon collector 111 disposed between the single crystal silicon-germanium alloy intrinsic base layer 132 and the n+ type buried collector 110 in the second embodiment.

Figure 7:
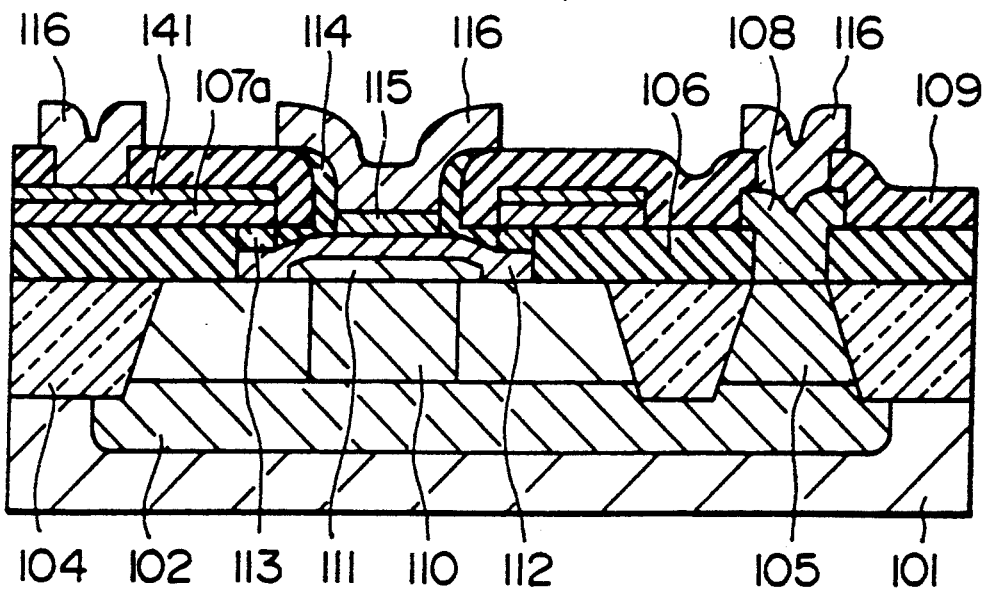
FIG. 7 is a sectional view illustrating a third embodiment of the present invention.
Figure 8:
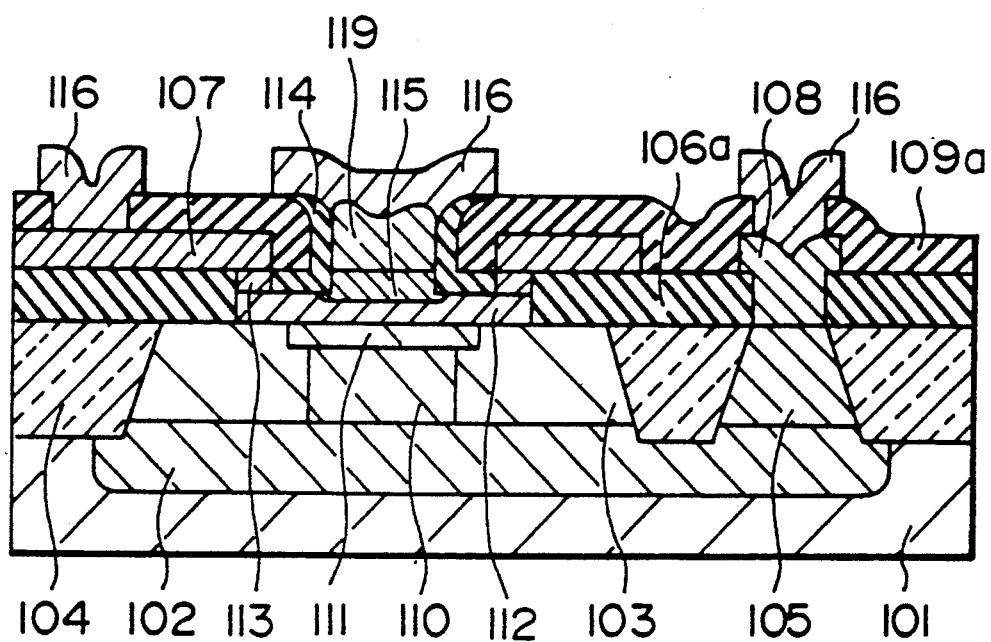
FIG. 8 is a sectional view illustrating a fourth embodiment of the present invention.

Referring to FIG. 7, which is a sectional view of a bipolar transistor, a third embodiment of the present invention is illutrated wherein a titanium silicide film 141 is provided on the upper surface of the p+ type base electrode polycrystalline silicon 107a to construct a double structure for reduction of the base resistance. Another arrangement excepting this is the same as that of the first embodiment.

The arrangement that features the third embodiment is realized by forming p+ type polycrystalline silicon over the entire surface of a wafer, then sputtering a titanium film over the entire surface of the same, and forming a titanium silicide film on the resulting surface with a heat treatment, and further patterning a resulting double-layered film. Sheet resistance of the p+ type base electrode polycrystalline silicon 107 of about 250 nm thickness in the first embodiment is of $\rho=8$ to $9\Omega/\square$. In the present embodiment, sheet resistance of the double layered film comprising the about 100 nm thickness titanium silicide film 141 and the about 150 nm thickness p+ type base electrode polycrystalline silicon 107a is of $\rho=2$ to $3\Omega/\square$, which is satisfactorily low resistance.

It is noted that another high melting point metal silicide film may be employed instead of the titanium silicide film 141 in the third embodiment.

Referring to FIGS. 8 to 12, there will be described fourth through sixth embodiments of the present invention. The fourth through sixth embodiments are different from the foregoing first through third embodiments as follows: The silicon oxide film 106 and the silicon nitride film in the first through third embodiments are replaced by a silicon nitride film 106a and a silicon nitride film 109 in the fourth through sixth embodiments, respectively. Further, in the fourth through sixth embodiments, the n⁻ type silicon epitaxial layer 103 is made thinner to about 0.7 μm, and the n⁻ type single crystal silicon collector 111 is formed in the recessed portion in the surface of the epitaxial layer 103 such that the suface of the former substantially coincides with the surface of the latter. Concentration of the n type buried collector 110 in the vicinity of the surface of the same is of about $1 \times 10^{17}$ cm⁻³ in the fourth through sixth embodiments. Further, the n+ type single crystal silicon emitter 115 in the fourth through sixth embodiments is formed through selective epitaxial growth and simultaneously through diffusion from the n+ type emitter electrode polycrystalline silicon 119 disposed in an emitter opening. The polycrystalline silicon 119 is electrically isolated from the polycrytalline silicon graft base 113 through the silicon oxide film 114 like the single crystal silicon emitter 115.

In the following, a fabrication method of the fourth embodiment will be described in the order of processes illustated in FIGS. 9A to 9C and FIGS. 10A to 10C wherein the description of the present embodiment excepting the above different points will be omitted in order to eliminate the overlapping thereof because the description is the same as that of the first through third embodiments.

The n+ type buried layer 102 is first formed on the surface of the p⁻ type silicon substrate 101, and thereafter the n⁻ type silicon epitaxial layer 103 is formed on the surface of the substrate 101. The LOCOS oxide film 104 and the n+ type phosphorus diffusion layer 105 are formed on the n⁻ type silicon epitaxial layer 103. The silicon nitride film 106 is formed over the entire surface of a wafer. A silicon nitride film 106 on the n+ type phosphorus diffusion layer 105 is opened to form the n+ collector electrode polycrystalline silicon 108. The p+ type base electrode polycrystalline silicon 107 is selectively formed on the surface of the silicon nitride film 106 and successively a first silicon oxide film is formed over the entire surface of the wafer. In this step, the p+ type base electrode polycrystalline silicon 107 has been formed also on the emitter formation scheduled region.

Successively, with a photoresist taken as a mask, the first silicon oxide film and the p+ type base electrode polycrystalline silicon 107 in the emitter formation scheduled region (emitter opening) are etched and removed.

Figure 9A:
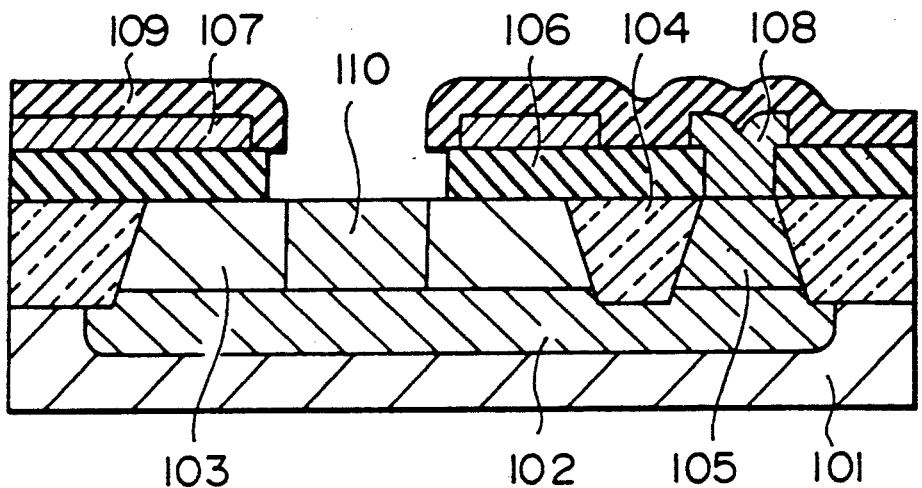
FIGS. 9A to 9C are sectional views illustating a first half of successive processes of fabricating the semiconductor device of the fourth embodiment.

After removal of the photoresist, a second silicon oxide film is formed over the entire surface of the wafer through an LPCVD process. The first and second oxide films are etched back to form the silicon oxide film 109. The upper and side surfaces of the p+ type base electrode polycrystalline silicon 107 are covered with the silicon oxide film 109 Along the side surface of the p+ type base electrode polycrystalline silicon 107 the silicon nitride film serves as a side wall of the same. Part of the silicon nitride film 106 in the emitter opening is dry-etched back and removed with use of the silicon oxide film 109 taken as a mask. At this time, the silicon nitride film 106 is left behind about 40 nm in the emitter opening. The n type buried collector 110, which reaches from the surface of the n⁻ type silicon epitaxial layer 103 to the n+ type buried layer 102, is formed by ion-implanting phosphorus with use of the silicon oxide film 109 and the like taken as a mask under the conditions of $2 \times 10^{12}$ cm⁻² at 200 keV and $2 \times 10^{12}$ cm⁻² at 300 keV, and activating the phosphorus with a heat treatment at 900° C. for 30 minutes. Thereafter, the silicon nitride film 106 left behind in the emitter opening is removed by hot phosphoric acid, as illustrated in FIG. 9A.

Figure 9B:
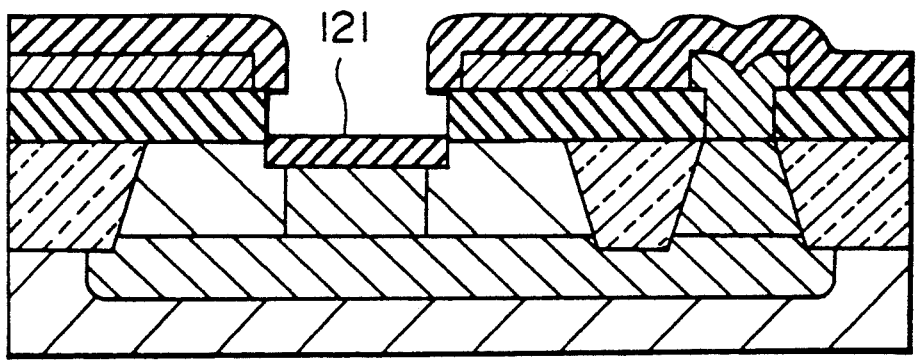

Successively, an about 50 nm thickness silicon oxide film 121 is formed by thermal oxidization on the surface of the single crystal silicon region (the n⁻ type slicon epitaxial layer 103 and the n type buried collector 110) along the bottom of the emitter opening, as illustrated in FIG. 9B.

Further, the silicon oxide film 121 is removed with an HF etching solution to form a recessed portion. The silicon oxide film 109 is also etched in this occasion but without causing any problem because the silicon oxide film 109 is sufficiently thicker than the silicon oxide film 121 in the present embodiments. The recessed portion is buried with a molecular beam epitaxy (MBE) process thereafter, and the n⁻ type single crystal collector 111 is selectively formed such that the surface of the recessed portion is coincident with the surface of the silicon epitaxial layer 103. For exemplary growth conditions of the n⁻ type single crystal silicon collector 111, a silicon wafer possessing a structure where a recessed portion is formed is rendered to RCA cleaning and HF etching and then placed in an MBE chamber, and a natural oxide film on the silicon is removed with a 850° C., about 10 minutes heat treatment. Thereafter, substrate temperature is set to 600° C. and 60 sccm $Si_2H_6$ containing $PH_3$ added thereto is injected for about 60 minutes to selectively grow the about 50 nm n⁻ type single crystal collector 111. Impurity concentration of the single crystal silicon collector 111 is controllable by the flow rate of the added $PH_3$. The impurity concentration of the single crystal silicon collector 111 is of about $1 \times 10^{15}$ cm⁻³ in the present example.

Figure 9C:
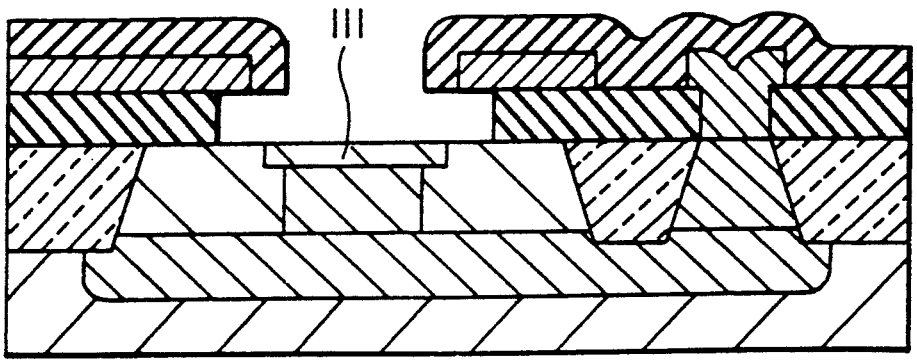

Successively, after the silicon wafer possessing the structure of FIG. 9B is taken out from the MBE chamber, the silicon nitride film 106 is again etched about 200 nm transversely thereof with the aid of hot phosphoric acid. Hereby, the p+ type base electrode polycrystalline silicon 17 is exposed at the bottom of the end thereof to form the first opening and the protrusion of the p+ type base electrode polycrystalline silicon 107, as illustrated in FIG. 9C.

Figure 10A:
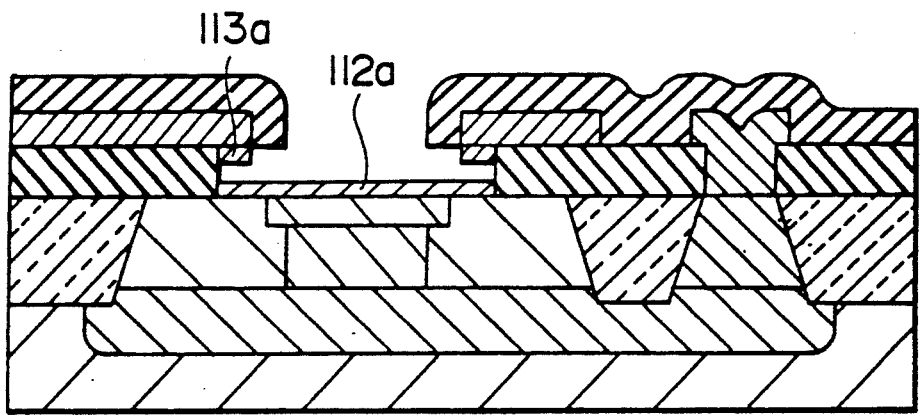
FIGS. 10A to 10C are sectional views illustrating a second half of successive processes of fabricating the semiconductor device of the fourth embodiment.
Figure 10B:
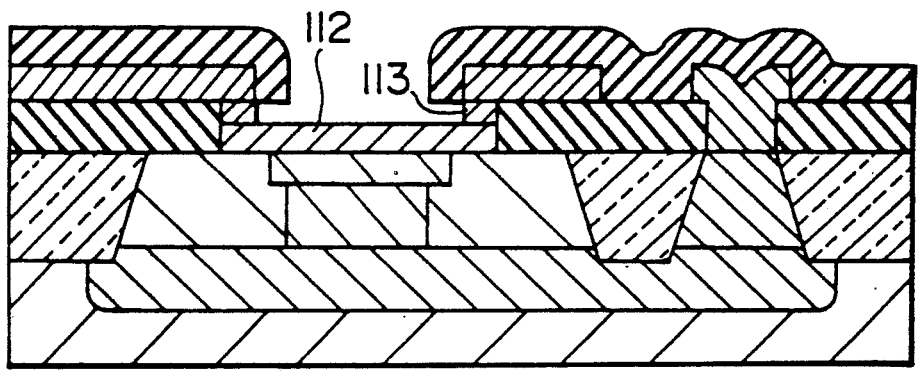

Further, the silicon is grown with $Si_2H_6$ containing $B_2H_6$ added thereto again using an MBE process. In the middle of the growth, a p+ type polycrystalline silicon graft base 113a is grown on the bottom (lower surface) of the p+ type base electrode polycrystalline silicon 107 at the foregoing protrusion, and a p+ type single crystal silicon intrinsic base layer 112a is grown on the surface of the exposed n⁻ type silicon epitaxial layer 103 and on the surface of the n⁻ type single crystal silicon collector 111 (the bottom of the first opening), as illustated in FIG. 10A. Further, the single crystal silicon intrinsic base layer 112a and the polycrystalline silicon graft base 113a are successively grown until they become the single crystal silicon intrinsic base layer 112 and the polycrystalline silicon graft base 113, respectively, and they are connected with each other, as illustrated in FIG. 10B.

Figure 10C:
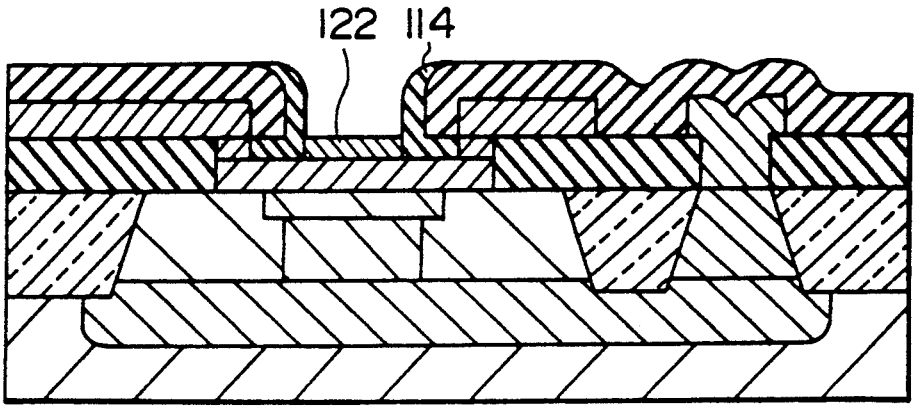

Further, the silicon oxide film 114 is formed over the entire surface of the wafer with an LPCVD process. The use of the LPCVD process causes the silicon oxide film 114 to be buried also in a space surrounded by the single crystal silicon intrinsic base layer 112, the polycrystalline silicon graft base 113, and the silicon oxide film 109. The silicon oxide film 114 is etched back so that the silicon oxide film 14 is left behind into a configuration to cover the side of the silicon oxide film 109 to form the second opening. Use is again made of an MBE process to selectively grow the single crystal silicon 122 on the surface of the p type single crystal silicon intrinsic base layer 112a exposed to the second opening, as illustrated in FIG. 10C. It is noted here that the single crystal silicon 122 is of a non-implanted or an n type one.

Successively, the n+ type emitter polycrystalline silicon 119 is formed in the emitter opening and then heat-treated to alter part of the single crystal silicon intrinsic base layer 112 and the n+ type single crystal silicon 122 to the n+ type single crystal silicon emitter 115. In succession, a connection port is formed in the silicon nitride film and an Al electrode 116 is formed to yield a bipolar transistor of a structure illustrated in FIG. 8.

Figure 11:
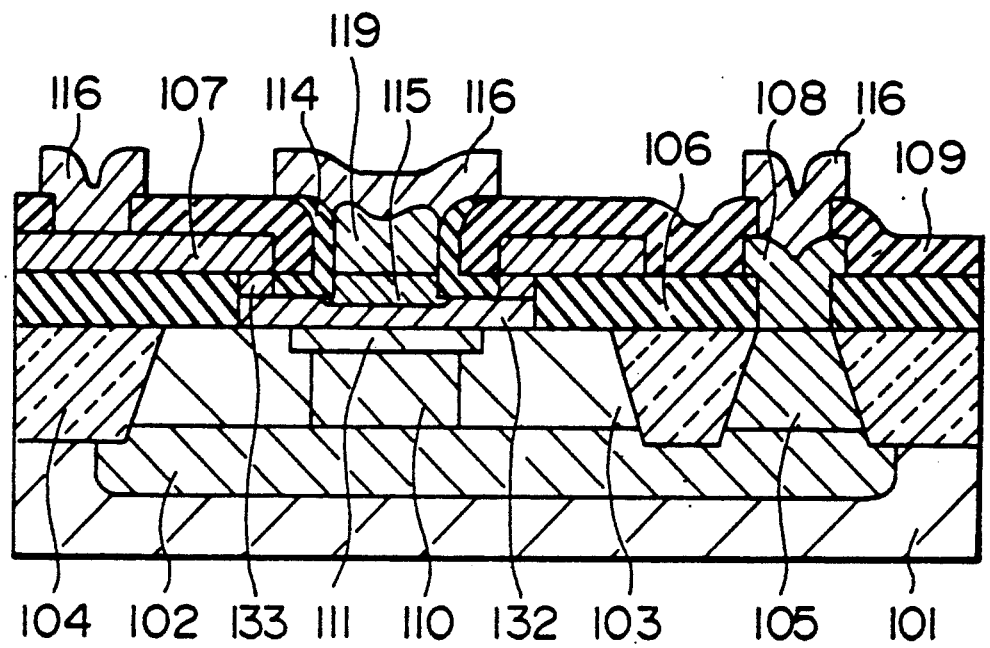
FIG. 11 is a sectional view illustrating a fifth embodiment of the present invention.
Figure 12:
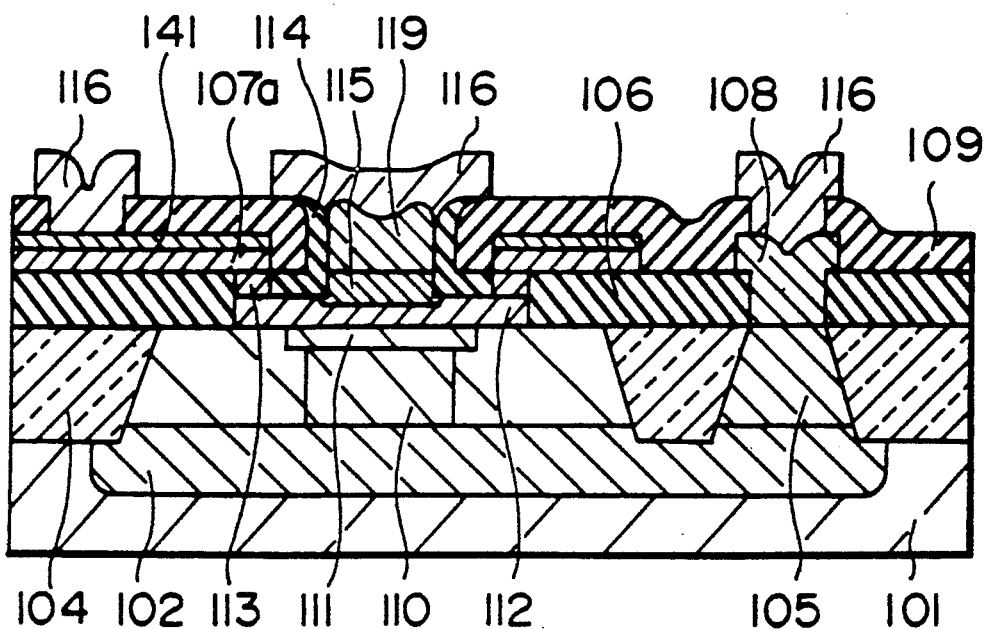
FIG. 12 is a sectional view illustrating a sixth embodiment of the present invention.

Fifth and sixth embodiments illustrated in FIGS. 11 and 12, respectively, are associated with the fourth embodiment through quite the same description as that of the second and third embodiments from the first embodiment, and hence the description is omitted to avoid overlapping.

What is claimed is:

1. A semiconductor device comprising:
    a first conductivity type first single crystal silicon layer disposed on the surface of a single crystal silicon substrate;
    a first insulating film disposed on the surface of said first single crystal silicon layer, covering the same therewith;
    a first opening formed through said first insulating film until it reaches said first single crystal silicon layer;
    a second conductivity type first polycrystalline silicon film disposed on said first insulating film, including a protrusion at said first opening;
    a second insulating film provided to cover the upper surface of said polycrystalline silicon film and further cover the sides of said first polycrystalline silicon film at said protrusion;
    a first conductivity type first single crystal semiconductor layer having lower impurity concentration than said first single crystal silicon layer and disposed on the surface of said first single crystal silicon layer, keeping a predetermined distance from said first insulating film;
    a second conductivity type polycrystalline semiconductor film, connected with the bottom of said polycrystalline silicon film at said protrusion;
    a second conductivity type second single crystal semiconductor layer disposed in said first opening, connected with the bottom of said polycrystalline semiconductor film, and covering said first single crystal semiconductor layer and a portion of said first single crystal silicon layer that is not covered with said first single crystal semiconductor layer;
    wherein said first single crystal semiconductor layer is separated from said polycrystalline semiconductor film by said second conductivity type second single crystal semiconductor layer;
    a third insulating film disposed on said second insulating film, covering therewith at least the sides and bottom of said second insulating film at said protrusion;

a second opening formed with said third insulating film, reduced in the shape thereof at a predetermined distance from the end of said protrusion; and a first conductivity type second single crystal silicon layer disposed on the surface of said second single crystal semiconductor layer at said second opening; wherein said first conductivity type second single crystal silicon layer is electrically isolated from said second conductivity type polycrystalline semiconductor film by said third insulating film.

2. A semiconductor device according to claim 1 wherein said first single crystal semiconductor layer has first conductivity type impurity concentration of less than $5 \times 10^{15}$ cm$^{-3}$ and has a thickness between 20 nm and 100 nm inclusive.

3. A semiconductor device according to claim 1 wherein said first conductivity type first single crystal semiconductor layer is a first conductivity type single crystal silicon layer, said second conductivity type polycrystalline semiconductor film is a second conductivity type polycrystalline silicon film, and said second conductivity type second single crystal semiconductor layer is a second conductivity type single crystal silicon layer.

4. A semiconductor device according to claim 1 wherein said first conductivity type first single crystal semiconductor layer is a first conductivity type single crystal silicon layer, said second conductivity type polycrystalline semiconductor film is a second conductivity type polycrystalline silicon-germanium alloy film, and said second conductivity type second single crystal semiconductor layer is a second conductivity type single crystal silicon-germanium alloy layer.

5. A semiconductor device according to claim 1 wherein said first conductivity type first single crystal semiconductor layer is a first conductivity type single crystal silicon-germanium alloy layer, said second conductivity type polycrystalline semiconductor film is a second conductivity type polycrystalline silicon-germanium alloy film, and said second conductivity type second single crystal semicondutor layer is a second conductivity type single crystal silicon-germanium alloy layer.

6. A semiconductor device according to claim 1 wherein said polycrystalline silicon film includes a refractory metal silicide film on the upper surface thereof.

7. A semiconductor device according to claim 1 wherein said single crystal silicon substrate and said first conductivity type first single crystal silicon layer are (100) oriented.

8. A semiconductor device comprising:
a first conductivity type first single crystal silicon layer disposed on the surface of a single crystal silicon substrate;
a first insulating film disposed on the surface of said first single crystal silicon layer, covering the same layer therewith;
a first opening formed through said first insulating film until it reaches said first single crystal silicon layer;
a second conductivity type first polycrystalline silicon film disposed on said first insulating film, including a protrusion at said first opening;
a second insulating film provided to cover the upper surface of said polycrystalline silicon film and further cover the sides of said first polycrystalline silicon film at said protrusion;
a recessed portion provided in the surface of said first single crystal silicon layer, keeping a predetermined distance from said first insulating film;
a first conductivity type first single crystal semiconductor layer having lower impurity concentration than said first single crystal silicon layer and selectively disposed on said recessed portion with the surface thereof substantially coincident with the surface of said first single crystal silicon layer;
a second conductivity type polycrystalline semiconductor film, connected with the bottom of said polycrystalline silicon film at said protrusion;
a second conductivity type second single crystal semiconductor layer disposed in said first opening, connected with the bottom of said polycrystalline semiconductor film, and covering said first single crystal semiconductor layer and a portion of said first single crystal silicon layer that is not covered with said first single crystal semiconductor layer; wherein said first single crystal semiconductor layer is separated from said polycrystalline semiconductor film by said second conductivity type second single crystal semiconductor layer;
a third insulating film disposed on said second insulating film, covering therewith at least the sides and bottom of said second insulating film at said protrusion;
a second opening formed with said third insulating film, reduced in the shape thereof at a predetermined distance from the end of said protrusion;
a first conductivity type second single crystal silicon layer disposed on the surface of said second single crystal semiconductor layer at said second opening; and
a first conductivity type second polycrystalline silicon film disposed on the surface of said first conductivity type second single crystal silicon layer at said second opening; wherein said first conductivity type second single crystal silicon layer is electrically isolated from said second conductivity type polycrystalline semiconductor film by said third insulating film.

9. A semiconductor device according to claim 8 wherein said first single crystal semiconductor layer has first conductivity type impurity concentration of $5 \times 10^{15}$ cm$^{-3}$ at most and has a thickness between 20 nm and 100 nm inclusive.

10. A semiconductor device according to claim 8 wherein said first conductivity type first single crystal semiconductor layer is a first conductivity type single crystal silicon layer, said second conductivity type polycrystalline semiconductor film is a second conductivity type polycrystalline silicon film, and said second conductivity type second single crystal semiconductor layer is a second conductivity type single crystal silicon layer.

11. A semiconductor device according to claim 8 wherein said first conductivity type first single crystal semiconductor layer is a first conductivity type single crystal silicon layer, said second conductivity type polycrystalline semiconductor film is a second conductivity type polycrystalline silicon-germanium alloy film, and said second conductivity type second single crystal semiconductor layer is a second conductivity type single crystal silicon-germanium alloy layer.

12. A semiconductor device according to claim 8 wherein said first conductivity type first single crystal semiconductor layer is a first conductivity type single crystal silicon-germanium alloy layer, said second conductivity type polycrystalline semiconductor film is a second conductivity type polycrystalline silicon-germanium alloy film, and said second conductivity type second single crystal semiconductor layer is a second conductivity type single crystal silicon-germanium alloy layer 13. A semiconductor device according to claim 8 wherein said polycrystalline silicon film includes a refractory metal silicide film on the upper surface thereof.

14. A semiconductor device according to claim 8 wherein said single crystal silicon substrate and said first conductivity type first single crystal silicon layer are (100) oriented.

15. A semiconductor device according to claim 1 wherein said single crystal silicon substrate comprises a first conductivity type layer disposed on a second conductivity type layer.

* * * * *